United States Patent [19]
DeNatale et al.

[11] Patent Number: 5,242,711
[45] Date of Patent: Sep. 7, 1993

[54] NUCLEATION CONTROL OF DIAMOND FILMS BY MICROLITHOGRAPHIC PATTERNING

[75] Inventors: Jeffrey D. DeNatale, Thousand Oaks; John F. Flintoff; Alan B. Harker; Patrick J. Hood, all of Thousand, Calif.; Gerald D. Robinson, Dayton, Ohio

[73] Assignee: Rockwell International Corp., Seal Beach, Calif.

[21] Appl. No.: 746,458

[22] Filed: Aug. 16, 1991

[51] Int. Cl.$^5$ ............................................. C23C 16/00
[52] U.S. Cl. .................... 427/249; 427/122; 427/309; 156/652; 156/653; 156/306.6; 156/308.2; 264/317; 428/408; 423/446
[58] Field of Search ............. 427/249, 122, 309, 402; 156/652, 653, DIG. 68, 306.6, 308.2; 264/317; 428/408; 423/446; 437/228

[56] References Cited

U.S. PATENT DOCUMENTS

| | | | |
|---|---|---|---|
| 4,907,846 | 3/1990 | Tustison et al. | 350/1.6 |
| 5,082,359 | 1/1992 | Kirkpatrick | 359/642 |
| 5,082,522 | 1/1992 | Purdes et al. | 156/612 |

FOREIGN PATENT DOCUMENTS 61-144037 7/1986 Japan.
63-307196 12/1988 Japan.
2-104664 4/1990 Japan.

OTHER PUBLICATIONS

A. Kirkpatrick, B. Ward, and N. Economou, "Focused ion-beam crater arrays for induced nucleation of diamond film," J. Vac. Sci. Technol. B, vol. 7, No. 6, pp. 1947-1949, Nov./Dec. 1989.

J. Ma, H. Kawarada, T. Yonehara, J. Suzuki, Y. Yokota, and A. Hiraki, "Nucleation Control and Selective Growth of Diamond Particles Formed with Plasma CVD," Jour. of Crystal Growth, vol. 99, pp. 1206-1210, 1990.

J. Carlsson, "Novel and selective vapor deposition processes," Vacuum, vol. 41, Nos. 4-6, pp. 1077-1080, 1990.

T. Sugita, E. Nishikawa, and Y. Yoshida, "Pattern marking on synthetic diamond film by Penning discharge sputtering," Vacuum, vol. 41, Nos. 4-6, pp. 1371-1373, 1990.

K. Kobashi, T. Inoue, H. Tachibana, K. Kumagai, K. Miyata, K. Nishimura, and A. Nakaue, "Selected-area deposition of diamond films," Vacuum, vol. 41, Nos. 4-6, pp. 1383-1386, 1990.

Primary Examiner—Roy King
Attorney, Agent, or Firm—John C. McFarren

[57] ABSTRACT

A high temperature resist process is combined with microlithographic patterning for the production of materials, such as diamond films, that require a high temperature deposition environment. A conventional polymeric resist process may be used to deposit a pattern of high temperature resist material. With the high temperature resist in place and the polymeric resist removed, a high temperature deposition process may proceed without degradation of the resist pattern. After a desired film of material has been deposited, the high temperature resist is removed to leave the film in the pattern defined by the resist. For diamond films, a high temperature silicon nitride resist can be used for microlithographic patterning of a silicon substrate to provide a uniform distribution of diamond nucleation sites and to improve diamond film adhesion to the substrate. A fine-grained nucleation geometry, established at the nucleation sites, is maintained as the diamond film is deposited over the entire substrate after the silicon nitride resist is removed. The process can be extended to form microstructures of fine-grained polycrystalline diamond, such as rotatable microgears and surface relief patterns, that have the desirable characteristics of hardness, wear resistance, thermal conductivity, chemical inertness, anti-reflectance, and a low coefficient of friction.

9 Claims, 3 Drawing Sheets

NUCLEATION CONTROL OF DIAMOND FILMS BY MICROLITHOGRAPHIC PATTERNING

TECHNICAL FIELD

The present invention relates to processes for producing diamond films and, in particular, to microlithographic patterning techniques for nucleation control and growth of fine-grained diamond films.

BACKGROUND OF THE INVENTION

Thin film materials such as ceramic superconductors, ferroelectrics, and synthetic diamond have significant applications in microelectronics, microoptics, and microdynamics. Polycrystalline diamond thin films, for example, offer a combination of highly desirable physical properties, including hardness, chemical inertness, transparency to light from the ultraviolet to the far infrared region, and resistance to laser damage. Synthetic diamond films, however, can be formed only under high temperature processing conditions. Furthermore, high temperature plasma and filament chemical vapor deposition (CVD) process produce diamond films that have large average grain size and many defects in the faceted crystals. In many applications, the optical and frictional characteristics of such diamond films are limited by the surface roughness produced by conventional deposition techniques. This roughness causes optical scattering from the visible range through the long wavelength infrared region. Large grains also provide a film that is too abrasive for direct use as a bearing surface for wear reduction. Methods exist for post-deposition polishing of polycrystalline diamond surfaces, but the large, irregular grain size of typical diamond film makes polishing difficult.

In many applications of diamond films it is desirable to provide a dense, uniform, fine-grained microstructure that has good optical characteristics and is amenable to post-deposition surface polishing. The fabrication of such diamond films, which may include microscale patterning for purposes of nucleation control, surface relief, and adhesion improvement, generally requires various masking, etching, deposition, and resist removal steps at temperatures that exceed the capabilities of commonly used photoresist materials. Because conventional polymeric resist materials tend to flow, glassify, carbonize, or crack if used above their maximum operating temperatures, they are unsatisfactory for high temperature microlithographic process steps. Thus, there is a need for microlithographic patterning techniques that provide high temperature processing capability, diamond nucleation control, and production of high quality, fine-grained diamond films, including microstructures and surface relief features.

SUMMARY OF THE INVENTION

Deposition of polycrystalline diamond thin films is inherently different from deposition of conventional optical thin film materials. The morphology of diamond films is controlled by the nucleation and growth of individual crystalline grains on the substrate surface. For optical applications, the desired polycrystalline microstructure comprises uniform, fine-grained nucleation geometries with no large, out-of-plane diamond particulates. To achieve this, the present invention uses microlithographic techniques to establish a uniform distribution of nucleation sites and a degree of control over the microstructure of the diamond film.

A high temperature microlithographic process, which forms part of the present invention and has application to a variety of high temperature processes, comprises a few basic steps. A conventional polymeric resist process is used to deposit a high temperature resist material. This process is performed at a temperature compatible with the polymeric resist, which is used to define the pattern of the high temperature resist. With the high temperature resist in place and the polymeric resist removed, a high temperature deposition process may proceed without degradation of the pattern provided by the high temperature resist. After the desired thin film of material has been deposited, the high temperature resist can be removed to leave the thin film material undamaged and in the pattern defined by the high temperature resist.

A high temperature resist comprising silicon nitride has been found to be useful in the deposition of fine-grained diamond films on silicon substrates. Silicon nitride is used for microlithographic patterning of the substrate to provide a uniform distribution of nucleation sites and to improve diamond film adhesion to the substrate. The diamond nucleates preferentially on the silicon substrate as opposed to the silicon nitride resist. After fine-grained nucleation has been initiated, the silicon nitride resist material can be removed so that diamond deposition can proceed over the entire substrate. The fine-grained nucleation geometry established at the nucleation sites is maintained as the diamond film grows over the entire substrate. If the nucleation sites are etched into the substrate, the resulting diamond film exhibits improved adhesion to the substrate. In addition, the process can be extended to form surface relief features, such as "moth eye" surfaces and rotatable microgears, for example. Such microstructures formed of fine-grained polycrystalline diamond can have the desirable characteristics of hardness, wear resistance, thermal conductivity, chemical inertness, antireflectance, and low coefficient of friction.

A principal object of the invention is to provide a process for producing high quality coatings, such as diamond films, that require a high temperature deposition environment. A feature of the invention is the use of a high temperature resist process for microlithographic patterning of a substrate to provide nucleation sites for diamond deposition. An advantage of the invention is the production of uniform, fine-grained, polycrystalline diamond films that may include microstructures, surface relief patterns, and improved adherence to the supporting substrate.

BRIEF DESCRIPTION OF THE DRAWINGS

For a more complete understanding of the present invention and for further advantages thereof, the following Detailed Description of the Preferred Embodiment makes reference to the accompanying Drawings, in which.

DETAILED DESCRIPTION OF THE PREFERRED EMBODIMENTS

It has been discovered that the morphology of diamond films is affected by the nucleation and growth of individual crystalline grains on a substrate surface. The desired polycrystalline microstructure for optical and wear-reduction applications comprises uniform, fine-grained nucleation geometries with no large, out-of-plane diamond particulates. The present invention includes microlithographic techniques for establishing a uniform distribution of diamond nucleation sites, controlling the microstructure of diamond films, improving the adhesion of diamond films to supporting substrates, and fabricating diamond microstructures, including microgears, that have characteristics such as hardness, wear resistance, thermal conductivity, chemical inertness, and low coefficient of friction.

HIGH TEMPERATURE RESIST PROCESS

Diamond films can be grown, for example, using microwave plasma-assisted chemical vapor deposition (PACVD) at 800–1500 watts with a source gas composition of approximately 0.1–2.0% $CH_4$, 0.0–1.0% $O_2$, and 97.0–99.5% $H_2$, and a substrate growth temperature of 400°–1200° C. Alternative methods of diamond film deposition include hot filament, plasma torch, and laser ablation processes. Because conventional polymeric resist materials tend to flow, glassify, carbonize, and crack at the high temperatures required for deposition of diamond films, the use of a resist layer for microlithographic patterning during diamond nucleation requires a resist material that can withstand high temperatures and reactive plasma environments.

The general characteristics of the high temperature resist process used in the present invention are: 1) a high temperature resist material that can be deposited at a temperature low enough that a conventional polymeric resist can be used to define the pattern of the high temperature resist; 2) a high temperature resist material that is stable in the reactive, high temperature environments needed for deposition of a diamond film; and 3) a high temperature resist material that can be removed selectively to leave its pattern in the deposited film.

Figure 1A:
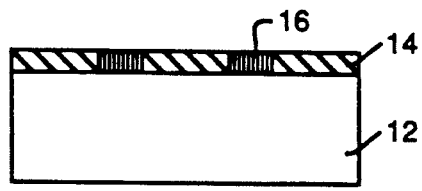
FIGS. 1A, 1B, 1C, 1D, 1E, 1F, 1G and 1H are schematic cross sections illustrating microlithographic patterning for diamond nucleation control using a high temperature resist process of the present invention.
Figure 1B:
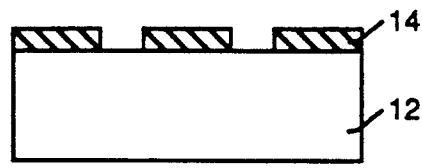
Figure 1C:
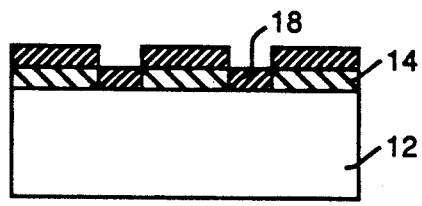
Figure 1D:
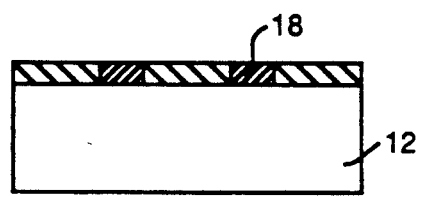
Figure 1E:
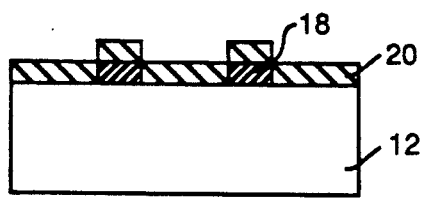
Figure 1F:
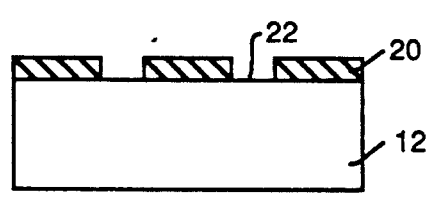
Figure 1G:
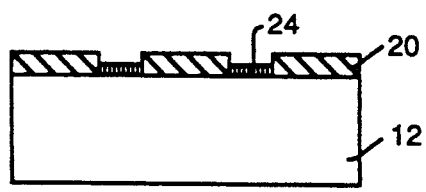

In the high temperature resist process illustrated schematically in the cross sections of FIGS. 1A–F, a conventional polymeric resist material 14 is applied, by spin coating for example, to a substrate 12. Substrate 12 may comprise silicon or some other suitable substrate material. A pattern 16 is written into resist layer 14 by electron beam lithography or by selectively exposing resist layer 14 through a mask (not shown), as is well known in the art. The resist is then developed, as is also well known in the art, to leave a pattern of resist material 14 on substrate 12 as illustrated in FIG. 1B. A layer of metal 18, such as aluminum for example, is deposited on substrate 12 over patterned resist layer 14 as shown in FIG. 1C. Resist layer 14 is then "lifted" using well known techniques to leave a pattern of metal 18 on substrate 12 as shown in FIG. 1D. A layer of high temperature resist material 20, such as $Si_3N_4$, $SiO_2$, AlN, BN, or SiC, for example, is deposited on substrate 12 over patterned metal layer 18 as shown in FIG. 1E. Patterned metal layer 18 is then dissolved to leave a patterned high temperature resist layer 20 on substrate 12 as shown in FIG. 1F. With patterned high temperature resist 20 in place, substrate 12 may be subjected to the high temperature conditions necessary for nucleation and growth of diamond films.

The high temperature resist process described above may be simplified for some applications by omitting the deposition of metal layer 18. The use of metal layer 18 provides very fine, sharp patterning of high temperature resist 20. For less demanding applications, the high temperature resist layer may be deposited directly over the patterned polymeric resist layer 14 of FIG. 1B. Lifting of patterned layer 14 would then leave the high temperature resist on substrate 12 in a pattern similar to patterned layer 18 in FIG. 1D.

MICROLITHOGRAPHIC PATTERNING FOR NUCLEATION CONTROL

The use of conventionally fabricated synthetic diamond films as optical and friction-reducing coatings is limited by the surface roughness of the as-deposited polycrystalline material. To achieve microstructures suitable for optical and friction-reducing applications, it is necessary to generate uniform, fine-grained nucleation geometries and restrict out-of-plane growth of large diamond particulates. The present invention combines the high temperature resist process described above with microlithographic patterning techniques to establish a uniform distribution of diamond nucleation centers and achieve some control over the diamond film microstructure.

Using the techniques of the present invention, substrate wafers, such as single-crystal silicon wafers, are patterned microlithographically prior to the growth of the diamond films. In any process step of the present invention where patterned resist material remains on the substrate during deposition of the diamond film, the high temperature resist process described above is used to provide the patterned resist. In addition, the substrate may be prepared with a diamond polish pretreatment to provide "seeding" for diamond nucleation. Experiments have shown that the use of different size diamond grit for surface pretreatment affects the nucleation crystal size and thus the final film microstructure.

Although many different microlithographic patterns may be used (depending on the desired characteristics of the finished diamond film), initial experiments were conducted using a silicon nitride ($Si_3N_4$) high temperature resist having a square grid pattern, with parallel grid lines separated by 10 μm of resist material and linewidths ranging from 0.5 to 1.5 μm.

Figure 1H:
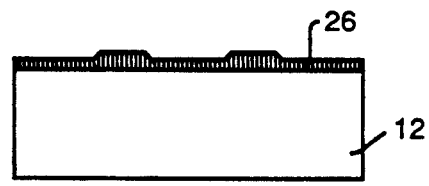

As shown in FIG. 1F, grid lines 22 in resist 20 expose the surface of silicon substrate 12. During diamond growth using the PACVD process described above, it was found that nucleation of fine-grained diamond crystals 24 (average crystallite size approximately 200 nm) occurred preferentially on exposed silicon substrate 12 rather than on silicon nitride resist 20. A two-hour initial growth period was used prior to removal of resist 20. Longer growth periods cause overgrowth of diamond crystals 24, making resist removal more difficult. Experiments using thicker resist layers, however, demonstrated that substantial diamond film thicknesses can be generated while maintaining an extremely fine grain structure. After nucleation in grid lines 22, removal of resist 20, and additional growth of diamond crystals 24, the open areas between the grid lines fill in completely to form a continuous diamond film 26 as shown in FIG. 1H. Diamond film 26 maintains the fine grain structure of the initial nucleation particles 24 across the entire surface of substrate 12. After continued growth of diamond film 26, the original grid lines 22 become indistinct.

During initial growth of diamond crystals 24 prior to removal of resist 20, nucleation occurred preferentially at the edges of grid lines 22 in all cases. For the 0.5 μm width grid lines, a single row of crystallites was generated. For grid line widths greater than 0.5 μm, the crystal size remained constant but two rows of crystals formed, one along each edge of grid line 22. Increasing the width of grid line 22 merely increased the spacing between the two nucleation rows along the edges of the line. It has been discovered that when a diamond grain renucleates a new crystal adjacent to it, the new crystal achieves the same size as the original crystal. Thus, the microstructure of the original diamond nucleation is self-propagating. Extended microscopic examination of diamond film 26 on substrate 12 showed a very uniform microstructure over the entire surface of substrate 12. Cross-sectional analysis in a scanning electron microscope (SEM) showed diamond film 26 to have no observable porosity in its microstructure across both the grid areas and the initially masked areas. The individual diamond grains were distinctly columnar in nature over the entire thickness of the film.

Figure 2A:
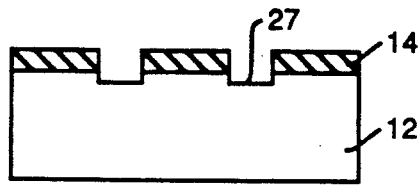
FIGS. 2A and 2B are schematic cross sections illustrating an alternative method of microlithographic patterning for nucleation control of diamond films.
Figure 2B:
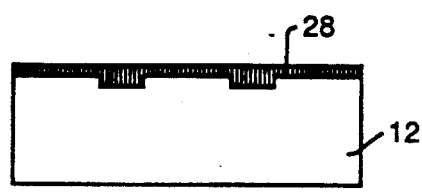

In a simplified variation of the foregoing process, high temperature resist 20 is not required. After forming patterned resist 14 on substrate 12, as shown in FIG. 2A, substrate 12 may be etched (using a well-known plasma etch process, for example) to form grid line grooves 27 in the surface of substrate 12. Resist layer 14 is then removed, and diamond film 28 is grown on the surface of substrate 12 as shown in FIG. 2B. Film 28 nucleates preferentially at the edges of grid lines 27, especially after pretreatment seeding as described above. Diamond film 28 generally has a courser microstructure than film 26 (which is nucleated with high temperature resist 20 in place to define grid lines 22, as described above). After nucleation in grid line grooves 27, film 28 grows uniformly over the entire surface of substrate 12, as illustrated in FIG. 2B.

MICROLITHOGRAPHIC PATTERNING FOR ADHESION IMPROVEMENT

Figure 3A:
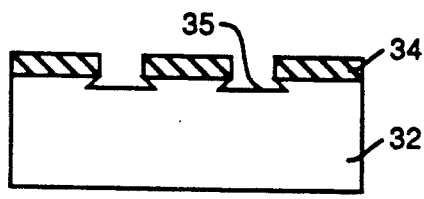
FIGS. 3A and 3B are schematic cross sections illustrating microlithographic patterning and substrate etching for nucleation control and adhesion improvement of diamond films.

Delamination is a common problem associated with diamond films prepared using conventional processes. An extension of the microlithographic techniques described above in conjunction with FIGS. 1A-H and 2A-B can be used to improve the adhesion of diamond films to the supporting substrate material. In FIG. 3A, a patterned resist layer 34 is disposed atop a substrate 32. Resist layer 34 provides microlithographic patterning for nucleation control of a diamond film. As described above, resist layer 34 may comprise high temperature resist material that remains in place during diamond nucleation, or it may comprise conventional polymeric resist material that is removed prior to the high temperature diamond nucleation process. With patterned resist layer 34 in place, substrate 32 is plasma etched, for example, to form cavities 35 in substrate 32 as determined by the pattern of resist layer 34. As illustrated in FIG. 3A, cavities 35 can be etched so as to undercut the surface of substrate 32 covered by resist layer 34.

Figure 3B:
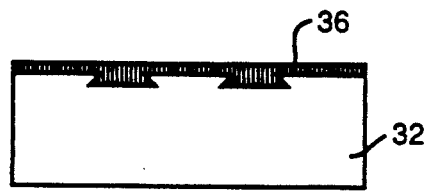

After cavities 35 have been etched, diamond film 36 may be grown on the surface of substrate 32 using the process described above. If resist 34 is a high temperature resist, diamond nucleation will occur preferentially in cavities 35. After nucleation, resist layer 34 is removed and diamond growth is continued to form diamond layer 36 as shown in FIG. 3B. If resist layer 34 is a low temperature resist that must be removed before diamond nucleation, nucleation will occur most readily in cavities 35, especially if pretreatment seeding is performed as described above. Because diamond nucleation initiates in cavities 35, which are etched to undercut the surface of substrate 32, diamond film 36 grows to become anchored firmly on substrate 32, as shown in FIG. 3B.

Figure 4A:
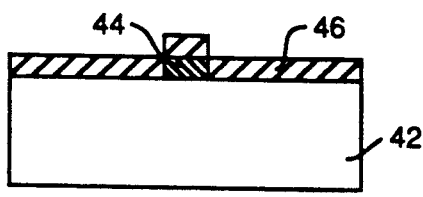
FIGS. 4A and 4B are schematic cross sections illustrating an alternative method of microlithographic patterning for adhesion improvement of diamond films.
Figure 4B:
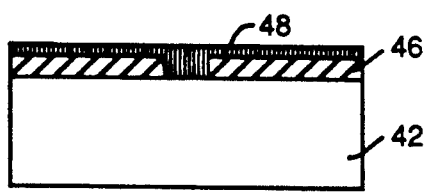

FIGS. 4A-B illustrate an alternative method of anchoring a diamond film 48 to a substrate 42. A patterned resist layer 44 is deposited on substrate 42 using the methods described above. An intermediate layer 46 is deposited atop substrate 42 and patterned resist layer 44. Resist layer 44 is then lifted to leave a pattern in intermediate layer 46. Layer 46 comprises a material such as $Si_3N_4$, AlN, SiC, or BN that adheres tightly to both substrate 42 and diamond film 48. After resist layer 44 is lifted, diamond film 48 is nucleated and grown atop substrate 42 and intermediate layer 46. Patterned intermediate layer 46 functions to bond diamond film 48 securely to substrate 42.

DIAMOND MOTH-EYE SURFACE FABRICATION

The relatively high refractive index mismatch between air and polycrystalline diamond films can cause significant reflection losses in optical devices. Reflection losses can be minimized by using thin diamond coatings limited to approximately a single quarter-wave optical thickness. The use of such very thin films, however, negates the the advantage of high mechanical durability that makes diamond coatings desirable in certain applications. As an alternative to thin coatings, surface relief structures on relatively thick, high refractive index substrate materials are known to be effective in reducing Fresnel reflection losses. Such surface relief features, commonly referred to as "moth eye" surfaces because of the natural analogy, use tapered surface patterning to provide, in effect, a refractive index gradient between the air and the substrate. As a result of this index gradient, surface relief profiles can be used to optimize the antireflection properties of optical materials.

The microlithographic patterning techniques described above can be used to produce antireflective diamond coatings. The problem of front surface reflective losses in thick diamond films can be minimized by producing moth eye surface relief patterns on the outer surfaces of the diamond films. For example, an antireflective coating that comprises a polycrystalline diamond film deposited atop a moth eye surface relief structure has been successfully fabricated on germanium (Ge) using microlithographic patterning techniques of the present invention. The progressive gradation in the effective refractive index between the air, the diamond film, and the substrate of this optical structure reduced Fresnel reflection losses to less than one percent.

Initial experiments were performed with polished Ge substrate samples, one inch diameter by one-quarter inch thick. The substrates were patterned by standard photolithographic techniques using a contact mask and UV exposure. The initial pattern was a square grid with lines 0.5 μm wide at 2.0 μm centerline spacing. As is known in the art, the specific antireflective and scatter properties of the resulting surface are a function of the spacing, depth, and cross-sectional geometry of the surface relief pattern. After exposure and development, the samples were plasma etched in $CH_4$—$O_2$ to produce the surface relief at an etch depth of about one quarter-wave optical thickness. A thin gold (Au) layer was deposited on the substrate before application of the photoresist and removed in the exposed areas by wet chemical etching. This step ensured adequate differential etching between the patterned and non-patterned regions in the event of complete removal of the photoresist during the etching process. After etching, the remaining photoresist and Au were removed, leaving the desired surface relief structure in the Ge substrate.

A thin buffer layer of AlN was applied to the surface relief structure of the Ge substrates prior to diamond growth to inhibit substrate surface etching during the plasma deposition process. The substrates were also prepared with diamond pre-treatment seeding to enhance film nucleation. The diamond seeding was achieved by sonicating the substrates in a solution of sub-micron diamond particles dispersed in isopropanol, followed by rinsing in isopropanol. This method of seeding was used to avoid mechanical damage to the substrate relief pattern that would result from diamond paste abrasion. After seeding, diamond films were grown on the Ge substrates using a PACVD process similar to that described above. Regions of the diamond film directly above the Ge surface peaks adopted roughly spherical morphologies. This result is consistent with the extremely high specific surface energy of diamond.

Figure 5A:
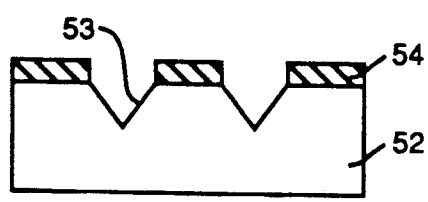
FIGS. 5A, 5B, 5C and 5D are schematic cross sections illustrating microlithographic techniques for fabrication of diamond relief patterns such as "moth eye" antireflection surfaces.
Figure 5B:
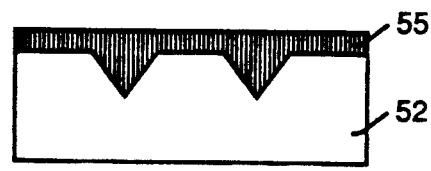

An alternative method of forming an antireflective diamond coating is illustrated in FIGS. 5A-D. A photoresist 54 is deposited atop substrate 52, which may comprise silicon, for example. Photoresist 54 may comprise a high temperature material, as described above in the basic process illustrated in FIGS. 1A-H, or a conventional polymeric material, as described in conjunction with FIGS. 2A-B, depending on the microstructural requirements of the deposited diamond film. Photoresist 54 is patterned using the steps described above so that an inverse of the desired diamond moth eye surface relief pattern can be etched into substrate 52. Etching of substrate 52 can be accomplished by well known dry and/or wet etching techniques. An advantage of a wet etching process is that anisotropic etching can be used to produce specific etch profiles, such as inverted cones, pyramids, spheres, square pillars, etc. As shown in FIG. 5A, photoresist 54 is patterned and substrate 52 is etched to form a plurality of evenly spaced inverted pyramids, such as etched cavity 53. After substrate 52 is etched, it can be seeded with diamond micro-particles, as described above, to aid diamond film nucleation. If photoresist 54 comprises a high temperature material, it can remain in place during PACVD nucleation and initial growth of fine-grained diamond in cavities 53. After nucleation, the high temperature resist material can be removed for continued diamond growth over the entire substrate. If photoresist 54 comprises conventional resist material, it must be removed before a high temperature PACVD diamond process can proceed. With conventional resist 54 removed, diamond nucleation occurs preferentially in cavities 53, particularly after seeding, and diamond growth continues over the entire surface of substrate 52. Using either process, a thick diamond film 55 is deposited over substrate 52, filling the plurality of cavities 53 as shown in FIG. 5B.

Figure 5C:
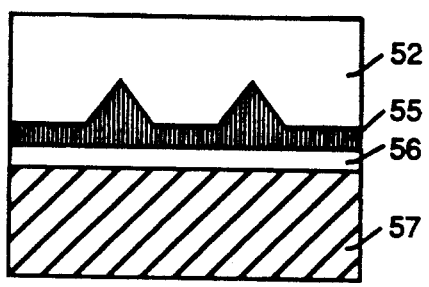
Figure 5D:
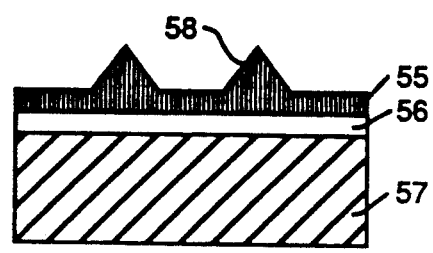

After thick diamond film 55 is formed on substrate 52, a process developed by Westinghouse may be used to bond diamond film 55 to a desired optical substrate 57, as illustrated in FIG. 5C. In this process, a low-temperature, refractive index-matched Chalcogenide glass 56, which may comprise $As_2S_3$ or $As_2Se_3$, for example, is used to bond diamond film 55 to optical substrate 57, which may comprise Ge, ZnS, or ZnSe, for example. After diamond film 55 is bonded to optical substrate 57 using glass layer 56, substrate 52 can be removed, as illustrated in FIG. 5D, by dissolving in acid, for example. With substrate 52 removed, thick diamond film 55 now has an exterior surface relief pattern comprising a plurality of evenly spaced pyramids 58, which create a moth eye surface. The actual relief pattern of diamond film 55, whether comprising cones, pyramids, spheres, or pillars, is the inverse of cavities 53 etched in original substrate 52. As a result, optical substrate 57 is bonded to a thick, tough, wear-resistant, antireflective diamond "moth eye" coating.

DIAMOND MICROSTRUCTURE FABRICATION

Potential uses for microstructural components include integration of microelectronic and micromechanical devices on a single chip and miniaturization of "smart" mechanisms. In the prior art, micromechanical components and systems have been fabricated from polysilicon. A limitation of polysilicon micromechanical devices, however, is that they are fragile and subject to friction, wear, and chemical degradation. To improve on conventional microstructure technology, the high temperature resist process described above in conjunction with FIGS. 1A-H can be used for nucleation control and growth of diamond microstructures. Polycrystalline diamond microstructures provide advantages because of diamond's extreme hardness, wear resistance, thermal conductivity, and chemical inertness. In addition, the low coefficient of friction of diamond is expected to reduce power consumption in driving diamond micromechanical mechanisms.

Figure 6A:
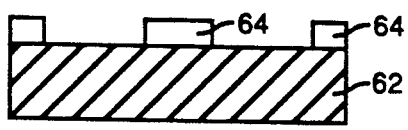
FIGS. 6A, 6B, 6C, 6D, 6E, 6F, 6G, 6H, 6I, 6J, 6K and 6L are schematic cross sections illustrating microlithographic techniques for fabrication of diamond microstructures such as rotatable microgears.
Figure 6B:
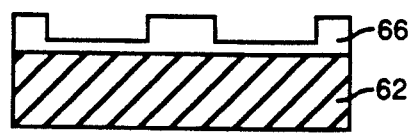
Figure 6C:
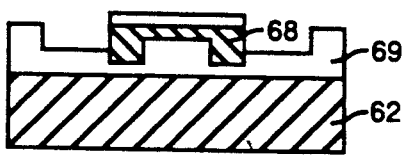
Figure 6D:
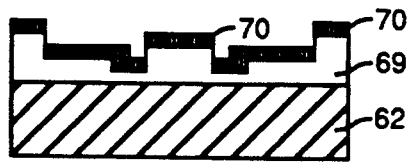
Figure 6E:
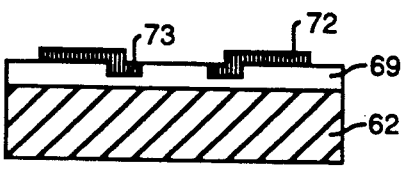
Figure 6F:
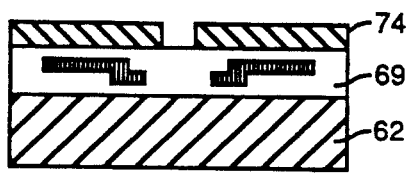
Figure 6G:
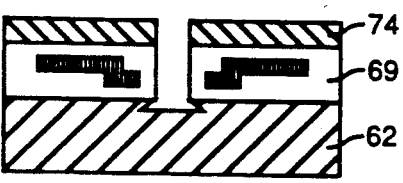
Figure 6H:
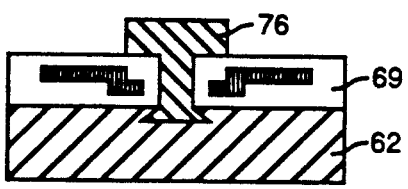
Figure 6I:
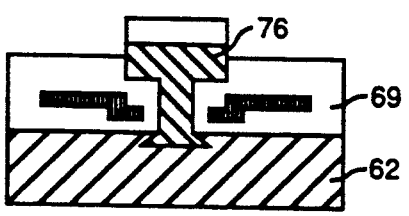
Figure 6J:
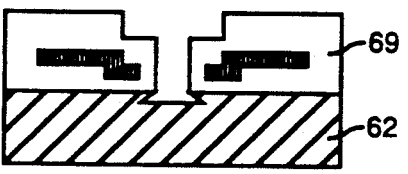
Figure 6K:
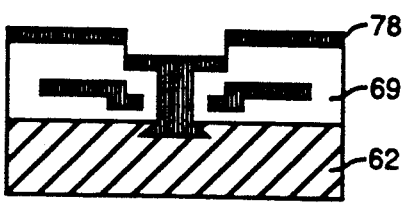
Figure 6L:
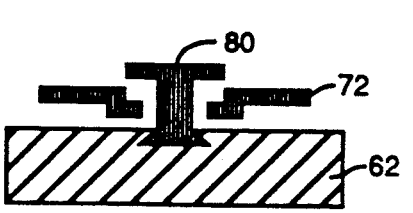

An example of the steps involved in fabricating a microstructural device are illustrated in FIGS. 6A-L. The process described produces a circular, rotatable diamond microgear on a silicon substrate using layers of high temperature silicon nitride ($Si_3N_4$) resist material. Other high temperature resist materials, such as $SiO_2$, are suitable as long as they are compatible with the diamond deposition environment and the resist removal process. The rotatable microgear, shown in cross section in FIG. 6L, is merely an example of the type of microstructures that can be fabricated using the method of the present invention.

As illustrated in FIG. 6A, a conventional photoresist material may be used to deposit a patterned layer 64 of high temperature photoresist material, such as $Si_3N_4$, on a substrate 62, comprising Si, for example. The pattern of layer 64 defines the central hole and the outer edges of a microgear to be fabricated. Additional high temperature resist material is deposited, by CVD deposition, for example, over the entire substrate to form resist layer 66 as illustrated in FIG. 6B. Resist layer 66 provides a sacrificial layer to free the microgear from the substrate.

FIG. 6C shows the structure after a conventional resist material is applied, exposed, and developed to form a sacrificial layer 68 in a circular pattern around and atop the center region of the microgear. With layer 68 in place, additional high temperature resist material is deposited atop layer 66 to form a built-up layer 69. Layer 68 is then stripped off leaving a slight ring-shaped depression in layer 69 around the center region of the microgear. As an alternative to using layer 68, the ring-shaped depression around the center region of the microgear can be formed by covering the entire substrate, except for the central area, and plasma or reactive ion etching the exposed area to form the depression. As illustrated in FIG. 6D, a diamond film 70 is then grown atop layer 69 using a process that may include diamond seeding, nucleation, and growth by microwave plasma CVD, hot filament, plasma torch, or laser ablation, for example. High temperature resist layer 69 is then etched to remove extraneous diamond film at the center and around the edges to leave a ring-shaped diamond microgear 72 atop etched layer 69, as shown in FIG. 6E. With carefully controlled etching, microgear 72 remains because resist layer 69 etches faster than diamond film 70. The ring-shaped depression formed in layer 69 produces an inner flange or rim 73 on microgear 72 that functions to minimize contact and reduce friction between microgear 72 and substrate 62 when the structure is completed.

After forming microgear 72, resist layer 69 is built back up, by CVD deposition for example, to provide a sacrificial layer separating microgear 72 from a hub to be formed in the center. As shown in FIG. 6F, built-up layer 69 is covered with a conventional photoresist layer 74 that is developed to expose a circular area at the center of microgear 72. As shown in FIG. 6G, the exposed area of layer 69 is etched down to substrate 62. The etching step may continue so as to etch into, and perhaps undercut, the surface of substrate 62 to provide an anchor for a central hub. The etched structure of FIG. 6G is then covered with conventional photoresist, exposed, and developed to form resist structure 76, as shown in FIG. 6H, which defines a retaining flange or lip for the central hub. With resist structure 76 in place, high temperature resist layer 69 is built up again, as shown in FIG. 6I, in preparation for constructing the central hub. As shown in FIG. 6J, resist structure 76 is stripped off to leave a cavity in high temperature resist layer 69 for construction of the central hub. Using the steps of diamond seeding, nucleation, and growth described above, polycrystalline diamond is deposited, as shown in FIG. 6K, as a layer 78 that fills the cavity formed in resist layer 69. Finally, resist layer 69 is stripped, using hot buffered HF, for example, to leave a polycrystalline diamond structure comprising a hub 80 anchored in substrate 62 and having an upper retaining flange, and circular microgear 72 that is detached and free to rotate about central hub 80.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

We claim:

1. A method of forming a fine-grained polycrystalline diamond film on a substrate, comprising the steps of:
depositing a patterned resist material on the substrate, said patterned resist material exposing selected areas of the substrate having linewidths in the range of approximately 0.5 to 1.5 $\mu$m to form diamond nucleation sites on the substrate:
nucleating polycrystalline diamond on the substrate at said nucleation sites, said nucleated polycrystalline diamond having a fine-grained structure with average diamond crystallite size of approximately 200 nm;
stripping said resist material from the substrate after nucleating said polycrystalline diamond; and
growing a diamond film atop the substrate, said diamond film comprising said fine-grained structure of said nucleated polycrystalline diamond.

2. The method of claim 1, further comprising the step of etching the substrate at said diamond nucleation sites to improve adhesion of the diamond film to the substrate.

3. The method of claim 1, further comprising the step of etching the substrate at said diamond nucleation sites to form a surface relief pattern in the substrate.

4. The method of claim 3, wherein the step of growing said diamond film comprises growing said diamond film atop said surface relief pattern of the substrate, thereby forming a diamond film having a bottom surface relief pattern comprising an inverse of said substrate surface relief pattern.

5. The method of claim 4, further comprising the steps of:
bonding the top surface of the diamond film to an optical material; and
removing the substrate from the diamond film to expose the bottom surface relief pattern of the diamond film.

6. The method of claim 1, further comprising the step of seeding said diamond nucleation sites with submicron diamond particles prior to nucleating said polycrystalline diamond.

7. The method of claim 1, further comprising the steps of:
depositing alternating layers of diamond film and resist material;
stripping said layers of resist material to leave a plurality of diamond layers forming a diamond structure.

8. The method of claim 7, wherein the step of depositing said alternating layers includes depositing a layer of diamond film detached from the substrate, said detached diamond film forming an element of said diamond structure free from the substrate.

9. The method of claim 8, wherein the step of forming said element of said diamond structure free from the substrate comprises the step of forming a diamond microgear rotatable about a diamond hub attached to the substrate.

* * * * *